United States Patent
Guo et al.

(10) Patent No.: US 11,737,310 B2
(45) Date of Patent: Aug. 22, 2023

(54) FLEXIBLE DISPLAY MODULE, METHOD FOR MANUFACTURING THE SAME, AND FLEXIBLE DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanzheng Guo, Beijing (CN); Wenqiang Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 350 days.

(21) Appl. No.: 16/909,405

(22) Filed: Jun. 23, 2020

(65) Prior Publication Data

US 2021/0028396 A1   Jan. 28, 2021
US 2023/0171987 A9   Jun. 1, 2023

(30) Foreign Application Priority Data

Jul. 22, 2019   (CN) .......................... 201910660745.3

(51) Int. Cl.
*G06F 3/041*   (2006.01)
*H10K 50/844*   (2023.01)
(Continued)

(52) U.S. Cl.
CPC ......... *H10K 50/844* (2023.02); *G06F 3/0412* (2013.01); *H10K 59/131* (2023.02);
(Continued)

(58) Field of Classification Search
CPC ............... H01L 51/5253; H01L 27/323; H01L 27/3276; H01L 51/56; H01L 2227/323;
(Continued)

(56) References Cited

U.S. PATENT DOCUMENTS

2014/0168539 A1   6/2014   Kim et al.
2016/0041664 A1   2/2016   Qin et al.
(Continued)

FOREIGN PATENT DOCUMENTS

CN   104166489 A   11/2014
CN   106325608 A   1/2017
(Continued)

OTHER PUBLICATIONS

First Office Action received for Chinese Patent Application No. 201910660745.3, dated Dec. 3, 2020, 28 pages (16 pages of English Translation and 12 pages of Original Document).
(Continued)

*Primary Examiner* — Kevin Quarterman
(74) *Attorney, Agent, or Firm* — Womble Bond Dickinson (US) LLP

(57) ABSTRACT

Embodiments of the present disclosure provide a flexible display module, a method for manufacturing the flexible display module, and a flexible display device, which relate to the field of display technology and can simplify the manufacturing process of the flexible display module. The flexible display module includes: a flexible display panel, and a first transparent conductive layer disposed on the light exit side of the flexible display panel. The flexible display panel includes a main display region, a bending region, and a driving circuit region. The main display region includes a pixel array layer. The first transparent conductive layer includes a first touch electrode located in the main display region, a driving circuit located in the driving circuit region,
(Continued)

a first touch electrode lead electrically connected to the first touch electrode and the driving circuit, respectively, and a wiring electrically connecting the pixel array layer and the driving circuit.

10 Claims, 6 Drawing Sheets

(51) Int. Cl.
    *H10K 59/40*         (2023.01)
    *H10K 59/131*      (2023.01)
    *H10K 71/00*         (2023.01)
    *H10K 59/12*         (2023.01)
    *H10K 102/00*      (2023.01)

(52) U.S. Cl.
    CPC ............. *H10K 59/40* (2023.02); *H10K 71/00* (2023.02); *H10K 59/1201* (2023.02); *H10K 2102/311* (2023.02)

(58) Field of Classification Search
    CPC ......... H01L 2251/5338; H01L 51/0097; H01L 27/3244; G06F 3/0412; G06F 3/044; G06F 2203/04102; G06F 2203/04103; G09F 9/301
    See application file for complete search history.

(56) References Cited

U.S. PATENT DOCUMENTS

| | | | |
|---|---|---|---|
| 2017/0192575 | A1 | 7/2017 | Jin |
| 2019/0288048 | A1* | 9/2019 | Kang .................. H01L 27/3265 |
| 2020/0067016 | A1* | 2/2020 | Park .................... H01L 27/3246 |
| 2020/0075692 | A1* | 3/2020 | Park .................... H01L 27/3244 |
| 2020/0089351 | A1* | 3/2020 | Jeong .................... G06F 3/0448 |
| 2020/0110497 | A1* | 4/2020 | Jin ........................ G06F 3/0416 |
| 2020/0243574 | A1 | 7/2020 | Tian et al. |
| 2021/0141258 | A1* | 5/2021 | Maeda ................ G02F 1/13629 |
| 2021/0240294 | A1* | 8/2021 | Ko ........................ G06F 3/0416 |
| 2021/0255734 | A1 | 8/2021 | Xie et al. |
| 2021/0294475 | A1* | 9/2021 | Lee ....................... G06F 1/1626 |

FOREIGN PATENT DOCUMENTS

| | | |
|---|---|---|
| CN | 106601133 A | 4/2017 |
| CN | 107170764 A | 9/2017 |
| CN | 107346194 A | 11/2017 |
| CN | 109062441 A | 12/2018 |
| CN | 109273503 A | 1/2019 |
| GB | 2510234 A | 7/2014 |

OTHER PUBLICATIONS

Office Action received for Chinese Patent Application No. 201910660745.3, dated Jul. 5, 2021, 25 pages (14 pages of English Translation and 11 pages of Office Action).

* cited by examiner

--Prior Art--

FLEXIBLE DISPLAY MODULE, METHOD FOR MANUFACTURING THE SAME, AND FLEXIBLE DISPLAY DEVICE

RELATED APPLICATION

The present application claims the benefit of Chinese Patent Application No. 201910660745.3 filed on Jul. 22, 2019, the entire disclosure of which is incorporated herein by reference.

TECHNICAL FIELD

The present disclosure relates to the field of display technology, especially to a flexible display module, a method for manufacturing the same, and a flexible display device.

BACKGROUND

In recent years, the screen-to-body ratios of various display screens are getting larger and larger to meet the customer demand, and narrow-frame and frameless display screens have gradually become the mainstream of the market.

At present, narrow-frame and frameless display screens extend the bending region of the display screen using pad bending technology so as to bend the bonding region to the back of the display panel to reduce the area of the peripheral region on the periphery of display region.

However, the current pad bending technology requires addition of three mask processes, i.e., EBA (etch bending A) and EBB (etch bending B) etching and opening processes performed in the bending region, and a filling process performed at the openings of the bending region. As a result, the number of masks is undoubtedly increased, which further increases the manufacturing processes and manufacturing cost of the display screen.

SUMMARY

Embodiments of the present disclosure provide a flexible display module, a method for manufacturing the same, and a flexible display device, which can simplify the manufacturing process of the flexible display module.

In a first aspect, there is provided a flexible display module. The flexible display module comprises: a flexible display panel; and a first transparent conductive layer disposed on a light exit side of the flexible display panel. The flexible display panel comprises a main display region, a bending region, and a driving circuit region; the main display region comprises a pixel array layer. The first transparent conductive layer comprises a first touch electrode located in the main display region, a driving circuit located in the driving circuit region, a first touch electrode lead electrically connected to the first touch electrode and the driving circuit, respectively, and a wiring electrically connecting the pixel array layer and the driving circuit.

Optionally, the flexible display module further comprises: a second transparent conductive layer and an insulating layer stacked with the first transparent conductive layer on the light exit side of the flexible display panel. The first transparent conductive layer and the second transparent conductive layer are spaced apart by the insulating layer. The second transparent conductive layer comprises a second touch electrode located in the main display region, and a second touch electrode lead electrically connected to the second touch electrode and the driving circuit, respectively.

Optionally, the second transparent conductive layer is disposed between the first transparent conductive layer and the flexible display panel.

Optionally, the bending region is located between the main display region and the driving circuit region. The bending region comprises a groove. An edge of the groove close to the main display region is flush with an edge of the insulating layer close to the driving circuit region.

Optionally, the flexible display module further comprises: a planarization layer disposed on a side of the first transparent conductive layer facing away from the flexible display panel. The planarization layer covers the main display region, the bending region and the driving circuit region. A material of the planarization layer comprises an organic insulating material, and the planarization layer fills the groove.

In a second aspect, there is provided a flexible display device comprising the flexible display module described in any one of the foregoing embodiments.

In a third aspect, there is provided a method for manufacturing a flexible display module. The method comprises: forming a flexible display panel, the flexible display panel comprising a main display region, a bending region, and a driving circuit region, the main display region comprising a pixel array layer; and forming a first transparent conductive layer on a light exit side of the flexible display panel. The first transparent conductive layer comprising a first touch electrode located in the main display region, a driving circuit located in the driving circuit region, a first touch electrode lead electrically connected to the first touch electrode and the driving circuit, respectively, and a wiring electrically connecting the pixel array layer and the driving circuit.

Optionally, before forming a first transparent conductive layer on a light exit side of the flexible display panel, the method further comprises: forming a second transparent conductive layer and an insulating layer successively on the light exit side of the flexible display panel. The second transparent conductive layer comprises a second touch electrode located in the main display region, and a second touch electrode lead electrically connected to the second touch electrode and the driving circuit, respectively. The first transparent conductive layer and the second transparent conductive layer are spaced apart by the insulating layer.

Optionally, the bending region is located between the main display region and the driving circuit region. The method further comprises: forming a groove in the bending region. An edge of the groove close to the main display region is flush with an edge of the insulating layer close to the driving circuit region.

Optionally, forming a groove in the bending region comprises: forming an insulating film and a first photoresist pattern successively on a side of the second transparent conductive layer facing away from the flexible display panel, the first photoresist pattern comprising a photoresist completely-removed region, the photoresist completely-removed region at least corresponding to a portion of the bending region; over-etching the insulating film to obtain the insulating layer; stripping off the first photoresist pattern, and forming a second photoresist pattern on a side of the insulating layer facing away from the flexible display panel; and etching a portion of the flexible display panel that is located in the bending region to obtain the groove.

Optionally, after forming a first transparent conductive layer on the light exit side of the flexible display panel, the method further comprises: forming a planarization layer on a side of the first transparent conductive layer facing away from the flexible display panel, the planarization layer covering the main display region, the bending region, and the driving circuit region. A material of the planarization layer comprises an organic insulating material, and the planarization layer fills the groove.

BRIEF DESCRIPTION OF THE DRAWINGS

In order to more clearly illustrate embodiments of the present disclosure or technical solutions in the prior art, the drawings to be used for description of the embodiments or the prior art will be briefly introduced below. Obviously, the drawings described below are only some embodiments of the present disclosure. A person having an ordinary skill in the art may also obtain other drawings based on these drawings without spending inventive efforts.

DETAILED DESCRIPTION OF THE DISCLOSURE

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

A flexible display device may be used as a mobile phone, a tablet computer, a personal digital assistant (PDA), an in-vehicle computer, etc. The specific use of the flexible display device is not particularly limited in embodiments of the present disclosure.

Figure 1:
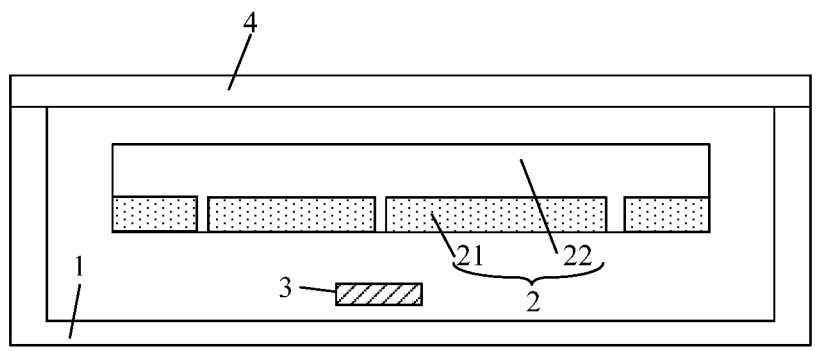
FIG. 1 is a schematic structural view of a flexible display device provided by an embodiment of the present disclosure.

As shown in FIG. 1, the flexible display device may comprise, for example, a frame 1, a flexible display module 2, a circuit board 3, a cover plate 4, and other electronic accessories including a camera and the like. The flexible display module 2 comprises a flexible display panel and a functional layer integrated on the flexible display panel. The functional layer may be, for example, a polarizer, a touch structure, or the like.

Taking the light exit direction of the above flexible display panel being top emission as an example, the frame 1 may be a U-shaped frame, and the flexible display module 2 and the circuit board 3 are disposed in the frame 1. The cover plate 4 is disposed on the light exit side of the flexible display module 2, and the circuit board 3 is disposed on a side of the flexible display panel facing away from the cover plate 4.

An embodiment of the present disclosure provides a flexible display module 2, which can be used as the flexible display module 2 in the above-mentioned flexible display device.

Figure 2A:
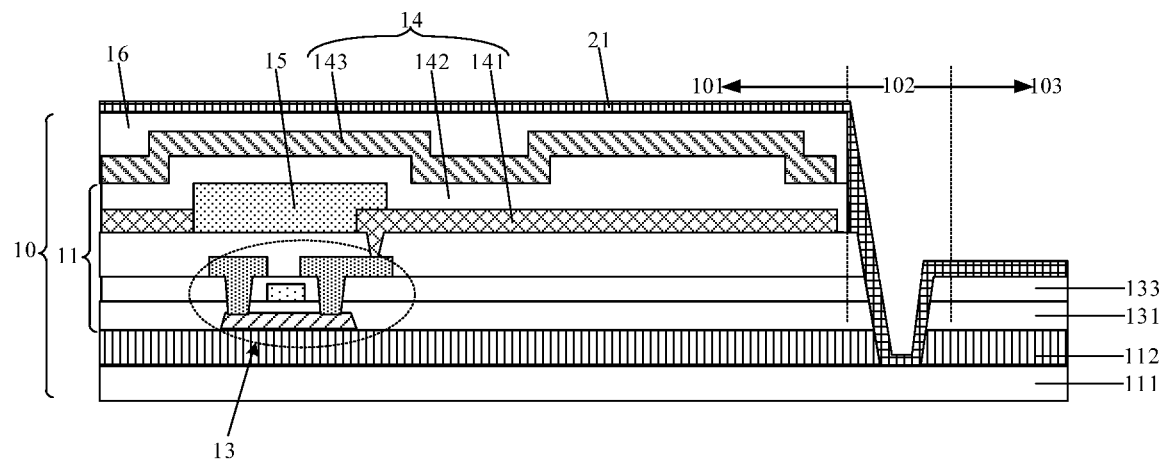
FIG. 2a is a schematic structural view of a flexible display module provided by an embodiment of the present disclosure.
Figure 2B:
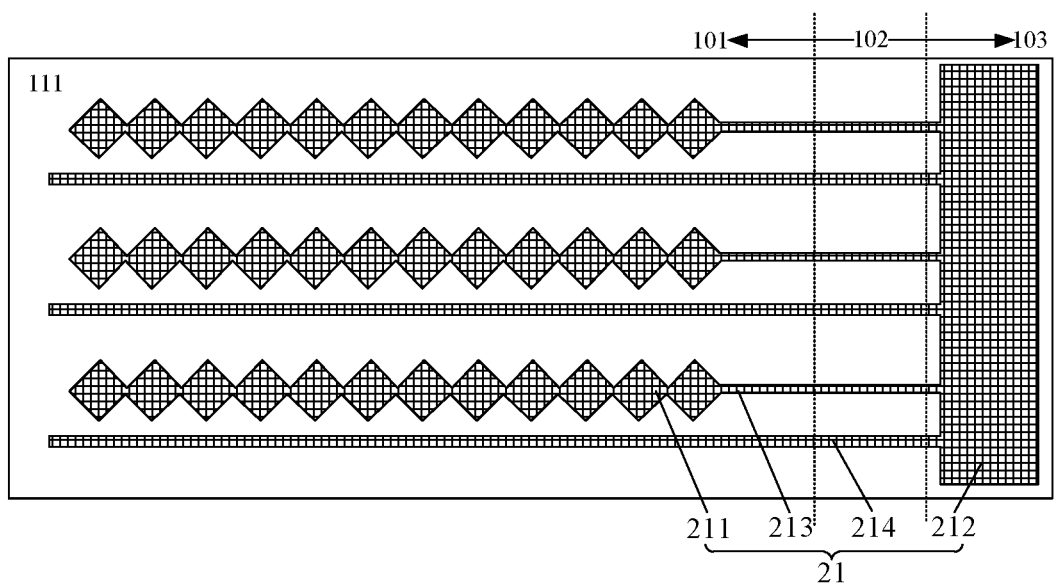
FIG. 2b is a top view of the embodiment shown in FIG. 2a in a direction perpendicular to the flexible display panel.

As shown in FIGS. 2a and 2b, the flexible display module 2 comprises a flexible display panel 10, and a first transparent conductive layer 21 disposed on the light exit side of the flexible display panel 10. The flexible display panel 10 comprises a main display region 101, a bending region 102, and a driving circuit region 103. The main display region 101 comprises a pixel array layer 11. The first transparent conductive layer 21 comprises a first touch electrode 211 located in the main display region 101, a driving circuit 212 located in the driving circuit region 103, and a first touch electrode lead 213 electrically connected to the first touch electrode 211 and the driving circuit 212, respectively, and a wiring 214 electrically connecting the pixel array layer and the driving circuit 212.

In some embodiments, the flexible display panel 10 may be, for example, an OLED display panel, a micro-light emitting diode (Micro-LED) display panel, or a quantum dot light emitting diode (QLED) display panel.

In some embodiments, the flexible display panel 10 comprises a plurality of sub-pixels. The pixel array layer in the flexible array substrate comprises functional structures for constituting sub-pixels.

For example, the pixel array layer comprises a pixel circuit and a light emitting device 14.

The pixel circuit comprises a thin film transistor 13, a capacitor, and the like. The thin film transistor 13 may be a bottom gate type, a top gate type, a double gate type, or the like.

Taking the flexible display panel 10 being an OLED display panel or a QLED display panel as an example, the light emitting device 14 comprises a first electrode 141, a light emitting functional layer 142, and a second electrode 143. A pixel defining layer 15 is provided between adjacent light emitting devices 14.

The first electrode 141 is an anode and the second electrode 143 is a cathode, or the first electrode 141 is a cathode and the second electrode 143 is an anode.

If the flexible display panel 10 is an OLED display panel, the light emitting functional layer 142 is an organic light emitting functional layer. If the flexible display panel 10 is a QLED display panel, the light emitting functional layer 142 is a quantum dot light emitting functional layer.

Taking the flexible display panel 10 being a Micro-LED display panel as an example, the light emitting device 14 is a Micro-LED light emitting unit. Each Micro-LED light emitting unit is electrically connected to a first operating voltage (VDD) layer and a second operating voltage (VSS) layer, respectively.

On this basis, the flexible display panel 10 further comprises an encapsulation layer 16 for encapsulating the light emitting device 14 so as to prevent the light emitting device 14 from being in contact with water vapor and oxygen.

In some embodiments, the driving circuit comprises a plurality of different output terminals, which are electrically connected to the first touch electrode lead and the wiring respectively so as to avoid a short circuit between the first touch electrode electrically connected to the first touch electrode lead and the pixel array layer electrically connected to the wiring.

In some embodiments, the wiring includes multiple sub-wirings, and each sub-wiring is electrically connected to at least part of the conductive structures in the pixel array layer.

Figure 3:
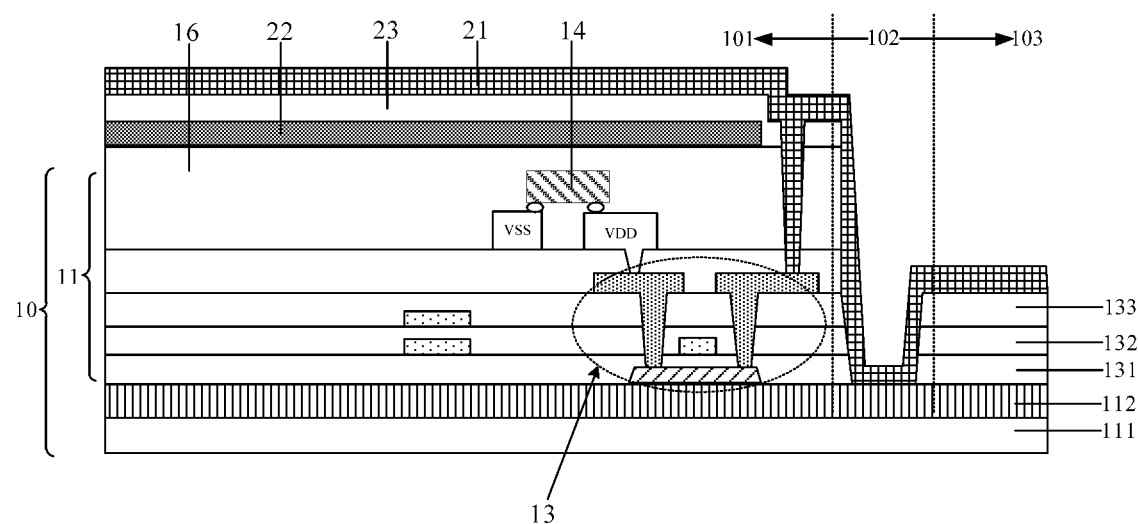
FIG. 3 is a schematic structural view of a flexible display module provided by an embodiment of the present disclosure.

For example, the thin film transistor 13 comprises conductive structures such as a gate, a source and a drain. The sub-wiring may be used as a gate line and electrically connected to the gate of the thin film transistor 13. As shown in FIG. 3, the sub-wiring may also be used as a data line and electrically connected to the source of the thin film transistor 13.

In some embodiments, in order to enable the flexible display module 2 to realize a touch function, the flexible display module 2 only comprises a layer of first touch electrode. Alternatively, the flexible display module 2 further comprises a second touch electrode disposed in a different layer from the first touch electrode.

In some embodiments, the first touch electrode is located in the main display region 101 and the driving circuit is located in the driving circuit region 103. Therefore, the first touch electrode lead electrically connected to the first touch electrode and the driving circuit respectively should be located in the main display region 101, the bending region 102, and the driving circuit region 103.

In some embodiments, the flexible display panel 10 comprises an array substrate, and the array substrate comprises a substrate. The substrate should at least comprise a flexible substrate 111. On this basis, the substrate may further comprise a spacer layer 112, and the material of the spacer layer 112 includes an inorganic insulating material.

Here, one or more layers of the flexible substrate 111 and the spacer layer 112 may be stacked alternately. On this basis, considering the higher flatness of the spacer layer 112 made of an inorganic material, a spacer layer 112 may be disposed at a position closest to the first transparent conductive layer 21 to improve the performance of the pixel array layer 11 disposed on the substrate.

Figure 4:
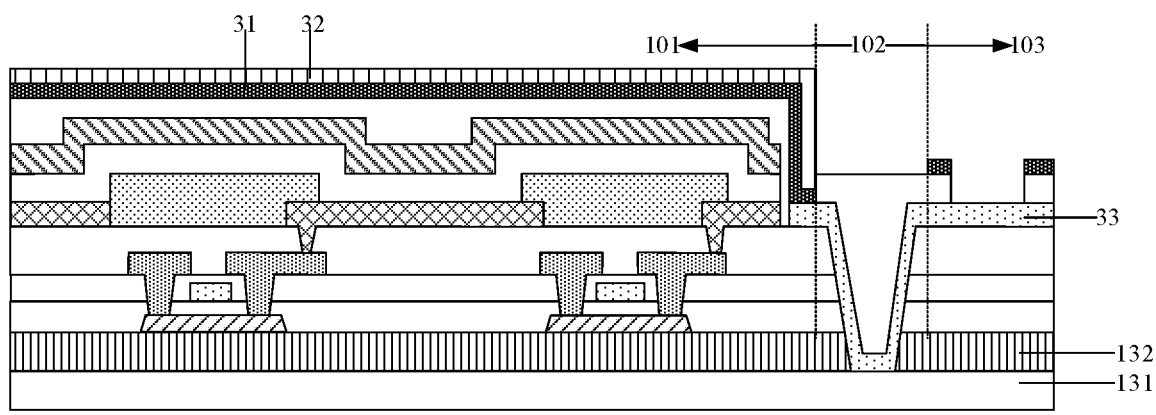
FIG. 4 is a schematic structural view of a flexible display module provided by the related art.

As shown in FIG. 4, in the related art, while the flexible display panel is being manufactured, the driving circuit 33 has been formed. In order to avoid a short circuit between a touch structure 32 and other signal wirings electrically connected to the driving circuit, there is a need to form an insulating structure 31 between the touch structure 32 and the flexible display panel, and the insulating structure 31 should at least expose the driving circuit 33, so that the touch structure 32 is electrically connected to the driving circuit 33. In this way, the insulating structure 31 has a certain pattern, which needs to be made by one mask process.

In the flexible display module provided by the embodiment of the present disclosure, on the one hand, the first transparent conductive layer comprises a driving circuit, a first touch electrode, a first touch electrode lead, and a wiring. Thus the driving circuit, the first touch electrode, the first touch electrode lead, and the wiring can be obtained using the same mask process, which can simplify the manufacturing process of the flexible display module 2 and reduce the manufacturing cost. On the other hand, since the driving circuit, the first touch electrode, the first touch electrode lead, and the wiring may be formed simultaneously, a short circuit will not occur among the first touch electrode, the first touch electrode lead, and the wiring. Compared with the related art, in embodiments of the present disclosure, there is no need to dispose an insulating structure between the flexible display panel and the first transparent conductive layer, which can further reduce one mask process and decrease the thickness of the flexible display module.

Optionally, as shown in FIG. 3, the flexible display module 2 further comprises a second transparent conductive layer 22 and an insulating layer 23 stacked with the first transparent conductive layer 21 on the light exit side of the flexible display panel 10. The first transparent conductive layer 21 and the second transparent conductive layer 22 are spaced apart by the insulating layer 23. The second transparent conductive layer 22 comprises a second touch electrode located in the main display region 101, and a second touch electrode lead electrically connected to the second touch electrode and the driving circuit, respectively.

In some embodiments, as shown in FIG. 3, the second transparent conductive layer 22 is located between the flexible display panel 10 and the first transparent conductive layer 21, or the second transparent conductive layer 22 is located on a side of the first transparent conductive layer 21 facing away from the flexible display panel 10.

In some embodiments, the material of the insulating layer 23 is not limited as long as it can provide an insulating effect. For example, the material of the insulating layer 23 is silicon nitride.

In some embodiments, the second touch electrode is located in the main display region 101 and the driving circuit is located in the driving circuit region 103. Therefore, the second touch electrode lead electrically connected to the second touch electrode and the driving circuit respectively should be located in the main display region 101, the bending region 102, and the driving circuit region 103.

In an embodiment of the present disclosure, the first touch electrode and the second touch electrode are disposed in different layers to realize mutual-capacitive touch.

Optionally, as shown in FIG. 3, the bending region 102 is located between the main display region 101 and the driving circuit region 103, and the bending region 102 comprises a groove. The edge of the groove close to the main display region 101 is flush with the edge of the insulating layer 23 close to the driving circuit region 103.

In some embodiments, the groove corresponds to the entire bending region 102. Alternatively, as shown in FIG. 3, the groove corresponds to a portion of the bending region 102.

As shown in FIG. 3, on the basis of an example in which the thin film transistor is a top gate type thin film transistor, the substrate includes a flexible substrate 111 and a spacer layer 112, and the spacer layer 112 is disposed closer to the first transparent conductive layer 21 than the flexible substrate 111, the portions in the spacer layer 112, the first gate insulating layer 131, the second gate insulating layer 132, and the interlayer insulating layer 133 that are located in the bending region 102 are hollowed out to form a groove. Since the total thickness of the spacer layer 112, the first gate insulating layer 131, the second gate insulating layer 132, and the interlayer insulating layer 133 is relatively large, both the EBA and EBB processes need to be performed to form the groove completely.

However, in an embodiment of the present disclosure, at the time of forming the insulating layer 23 between the first transparent conductive layer 21 and the second transparent conductive layer 22, in the case of ensuring that the insulating layer 23 covers the second transparent conductive layer 22, it is possible to etch at least one of the interlayer insulating layer 133, the second gate insulating layer 132, the first gate insulating layer 131, and the spacer layer 112 while the insulating layer 23 is being formed, thereby omitting one of the EBA or EBB process.

Figure 5:
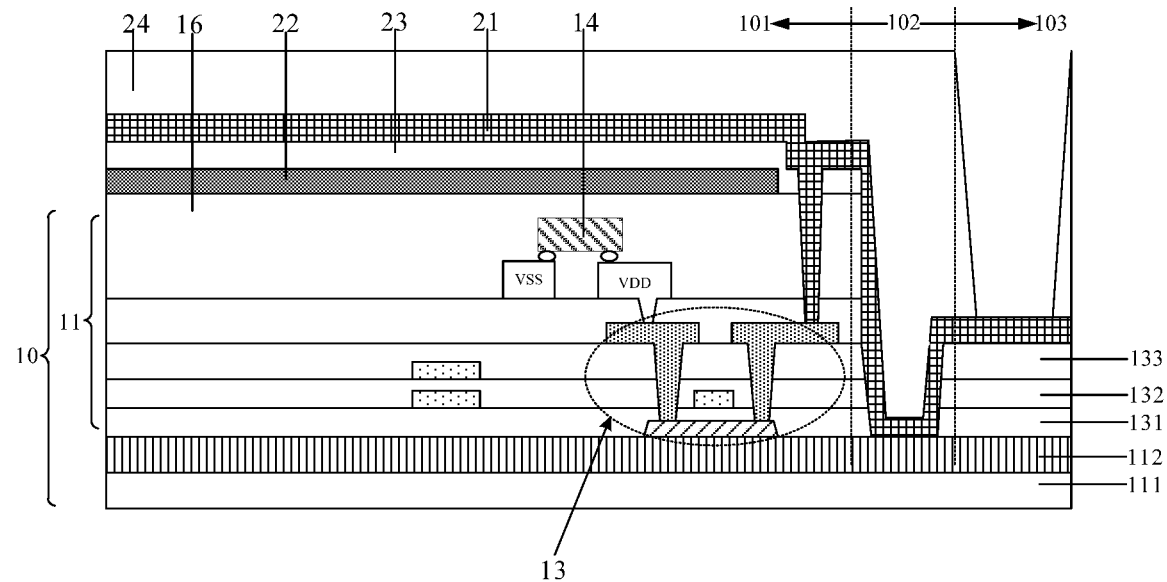
FIG. 5 is a schematic structural view of a flexible display module provided by an embodiment of the present disclosure.

Optionally, as shown in FIG. 5, the flexible display module 2 further comprises a planarization layer 24 disposed on a side of the first transparent conductive layer 21 facing away from the flexible display panel 10. The planarization layer 24 covers the main display region 101, the bending region 102, and driving circuit region 103. The material of the planarization layer 24 includes an organic insulating material, and the planarization layer 24 fills the groove.

In an embodiment of the present disclosure, the material of the planarization layer 24 includes an organic insulating material. The organic insulating material is more flexible than the inorganic insulating material. By filling the groove located in the bending region 102 with the planarization layer 24, on the one hand, the flexibility of the bending region 102 in the flexible display module 2 can be improved; on the other hand, compared with the prior art, the filling process after the EBA and EBB processes can be omitted, and one mask process can be further reduced.

Figure 6:
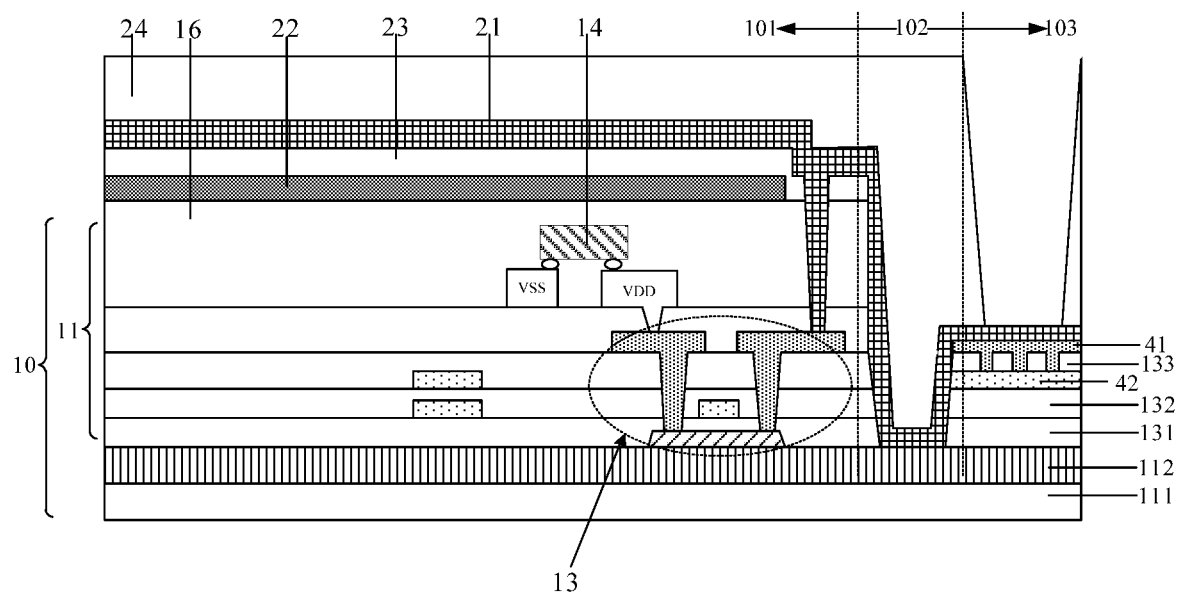
FIG. 6 is a schematic structural view of a flexible display module provided by an embodiment of the present disclosure.

Optionally, as shown in FIG. 6, the flexible display module 2 further comprises a first conductive structure 41 and a second conductive structure 42 located in the driving circuit region 103. The first conductive structure 41 and the second conductive structure 42 are stacked. The first conductive structure 41 or the second conductive structure 42 includes a plurality of protrusions. In the case where the first conductive structure 41 includes a plurality of protrusions, the protrusions are in direct contact with the second conductive structure 42. In the case where the second conductive structure 42 includes a plurality of protrusions, the protrusions are in direct contact with the first conductive structure 41.

On this basis, the first conductive structure 41 and the second conductive structure 42 are electrically connected to the first transparent conductive layer 21.

Here, the first conductive structure 41 and the second conductive structure 42 may be electrically connected to the first touch electrode lead. Alternatively, the first conductive structure 41 and the second conductive structure 42 may also be electrically connected to the wiring.

In an embodiment of the present disclosure, the resistance of the wiring or the first touch electrode lead can be reduced by jumpering the wiring or the first touch electrode lead in the first transparent conductive layer 21. On this basis, the gate line or data line can be jumpered, which can also play a role in preventing static electricity.

Figure 7:
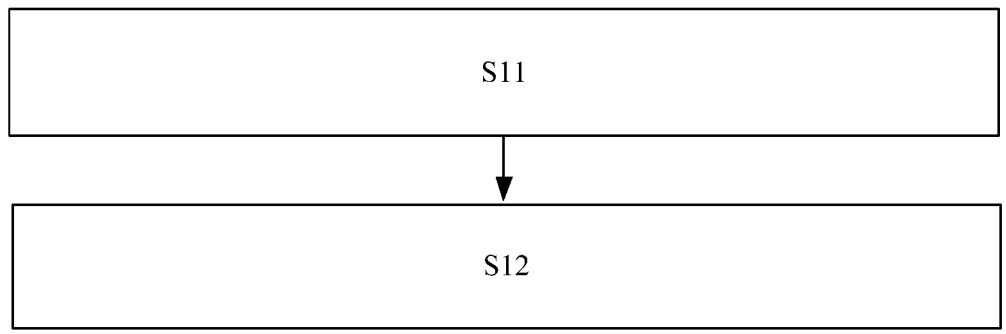
FIG. 7 is a flow chart of manufacturing a flexible display module provided by an embodiment of the present disclosure.

An embodiment of the present disclosure provides a method for manufacturing a flexible display module. As shown in FIGS. 2a, 2b and 3, a flexible display panel comprises a main display region 101, a bending region 102, and a driving circuit region 103. The main display region 101 comprises a pixel array layer 11. As shown in FIG. 7, the method for manufacturing the flexible display module 2 can be implemented by the following steps.

Figure 8:
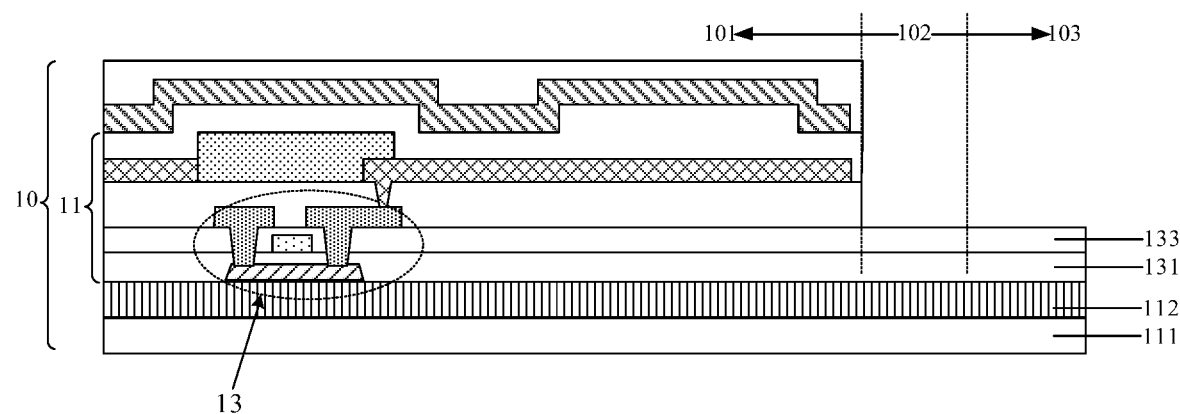
FIG. 8 is a schematic view illustrating a process of manufacturing a flexible display module provided by an embodiment of the present disclosure.
Figure 9:
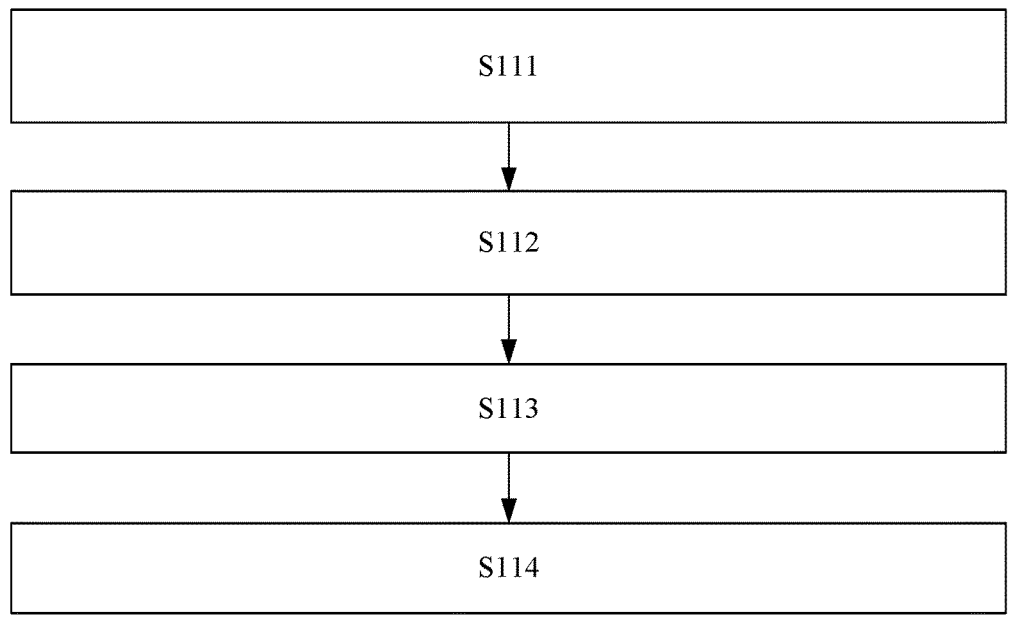
FIG. 9 is a flow chart of manufacturing a groove provided by an embodiment of the present disclosure.

S11, as shown in FIG. 8, forming a flexible display panel 10. The flexible display panel 10 comprises a main display region 101, a bending region 102, and a driving circuit region 103. The main display region 101 comprises a pixel array layer 11.

In some embodiments, the flexible display panel 10 may be, for example, an OLED display panel, a Micro-LED display panel, or a QLED display panel.

In some embodiments, the flexible display panel 10 comprises a plurality of sub-pixels. The pixel array layer in the flexible array substrate comprises functional structures for constituting sub-pixels.

For example, the pixel array layer comprises a pixel circuit and a light emitting device 14.

The pixel circuit comprises a thin film transistor 13, a capacitor, and the like. The thin film transistor 13 may be a bottom gate type, a top gate type, a double gate type, or the like.

Taking the flexible display panel 10 being an OLED display panel or a QLED display panel as an example, the light emitting device 14 comprises a first electrode 141, a light emitting functional layer 142, and a second electrode 143. A pixel defining layer 15 is provided between adjacent light emitting devices 14.

The first electrode 141 is an anode and the second electrode 143 is a cathode, or the first electrode 141 is a cathode and the second electrode 143 is an anode.

If the flexible display panel 10 is an OLED display panel, the light emitting functional layer 142 is an organic light emitting functional layer. If the flexible display panel 10 is a QLED display panel, the light emitting functional layer 142 is a quantum dot light emitting functional layer.

Taking the flexible display panel 10 being a Micro-LED display panel as an example, the light emitting device 14 is a Micro-LED light emitting unit. Each Micro-LED light emitting unit is electrically connected to a first operating voltage (VDD) layer and a second operating voltage (VSS) layer, respectively.

On this basis, the flexible display panel 10 further comprises an encapsulation layer 16 for encapsulating the light emitting device 14 to prevent the light emitting device 14 from being in contact with water vapor and oxygen.

In some embodiments, the flexible display panel 10 comprises an array substrate, and the array substrate comprises a substrate. The substrate should at least comprise a flexible substrate 111. On this basis, the substrate may further comprise a spacer layer 112, and the material of the spacer layer 112 includes an inorganic insulating material.

Here, one or more layers of the flexible substrate 111 and the spacer layer 112 may be stacked alternately. On this basis, considering the higher flatness of the spacer layer 112 made of an inorganic material, a spacer layer 112 may be disposed at a position closest to the first transparent conductive layer 21 to improve the performance of the pixel array layer 11 disposed on the substrate.

S12, as shown in FIGS. 2a and 2b, forming a first transparent conductive layer 21 on the light exit side of the flexible display panel 10. The first transparent conductive layer 21 comprises a first touch electrode 211 located in the main display region 101, a driving circuit 212 located in the driving circuit region 103, a first touch electrode lead 213 electrically connected to the first touch electrode 211 and the driving circuit 212, respectively, and a wiring 214 electrically connecting the pixel array layer and the driving circuit 212.

In some embodiments, the driving circuit comprises a plurality of different output terminals, which are electrically connected to the first touch electrode lead and the wiring respectively, so as to avoid a short circuit between the first touch electrode electrically connected to the first touch electrode lead and the pixel array layer electrically connected to the wiring.

In some embodiments, the wiring includes multiple sub-wirings, and each sub-wiring is electrically connected to at least part of the conductive structures in the pixel array layer.

For example, the thin film transistor 13 comprises conductive structures such as a gate, a source and a drain. The sub-wiring can be used as a gate line and electrically connected to the gate of the thin film transistor 13. As shown in FIG. 3, the sub-wiring can also be used as a data line and electrically connected to the source of the thin film transistor 13.

In some embodiments, in order to enable the flexible display module 2 to realize a touch function, the flexible display module 2 only comprises a layer of first touch electrode. Alternatively, the flexible display module 2 further comprises a second touch electrode disposed in a different layer from the first touch electrode.

In some embodiments, the first touch electrode is located in the main display region 101 and the driving circuit is located in the driving circuit region 103. Therefore, the first touch electrode lead electrically connected to the first touch electrode and the driving circuit respectively should be located in the main display region 101, the bending region 102, and the driving circuit region 103.

As shown in FIG. 4, in the related art, while the flexible display panel is being manufactured, the driving circuit 33 has been formed. In order to avoid a short circuit between a touch structure 32 and other signal wirings electrically connected to the driving circuit, there is a need to form an insulating structure 31 between the touch structure 32 and the flexible display panel, and the insulating structure 31 should at least expose the driving circuit 33, so that the touch structure 32 is electrically connected to the driving circuit 33. In this way, the insulating structure 31 has a certain pattern, which needs to be made by one mask process.

In the method for manufacturing a flexible display module provided by an embodiment of the present disclosure, on the one hand, the first transparent conductive layer comprises a driving circuit, a first touch electrode, a first touch electrode lead, and a wiring. Thus the driving circuit, the first touch electrode, the first touch electrode lead, and the wiring can be obtained using the same mask process, which can simplify the manufacturing process of the flexible display module 2 and reduce the manufacturing cost. On the other hand, since the driving circuit, the first touch electrode, the first touch electrode lead, and the wiring may be formed simultaneously, a short circuit will not occur among the first touch electrode, the first touch electrode lead, and the wiring. Compared with the related art, in embodiments of the present disclosure, there is no need to dispose an insulating structure between the flexible display panel and the first transparent conductive layer, which can further reduce one mask process and decrease the thickness of the flexible display module.

Optionally, before forming a first transparent conductive layer 21 on the light exit side of the flexible display panel, the method further comprises: forming a second transparent conductive layer 22 and an insulating layer 23 successively on the light exit side of the flexible display panel 10. The second transparent conductive layer 22 comprises a second touch electrode located in the main display region 101, and a second touch electrode lead electrically connected to the second touch electrode and the driving circuit, respectively.

The first transparent conductive layer 21 and the second transparent conductive layer 22 are spaced apart by the insulating layer 23.

In some embodiments, the material of the insulating layer 23 is not limited as long as it can provide an insulating effect. For example, the material of the insulating layer 23 is silicon nitride.

In some embodiments, the second touch electrode is located in the main display region 101 and the driving circuit is located in the driving circuit region 103. Therefore, the second touch electrode lead electrically connected to the second touch electrode and the driving circuit respectively should be located in the main display region 101, the bending region 102, and the driving circuit region 103.

In an embodiment of the present disclosure, the first touch electrode and the second touch electrode are disposed in different layers to realize mutual-capacitive touch.

Optionally, the bending region 102 is located between the main display region 101 and the driving circuit region 103, and the bending region 102 comprises a groove. A method for manufacturing the groove comprises the following steps.

Figure 10:
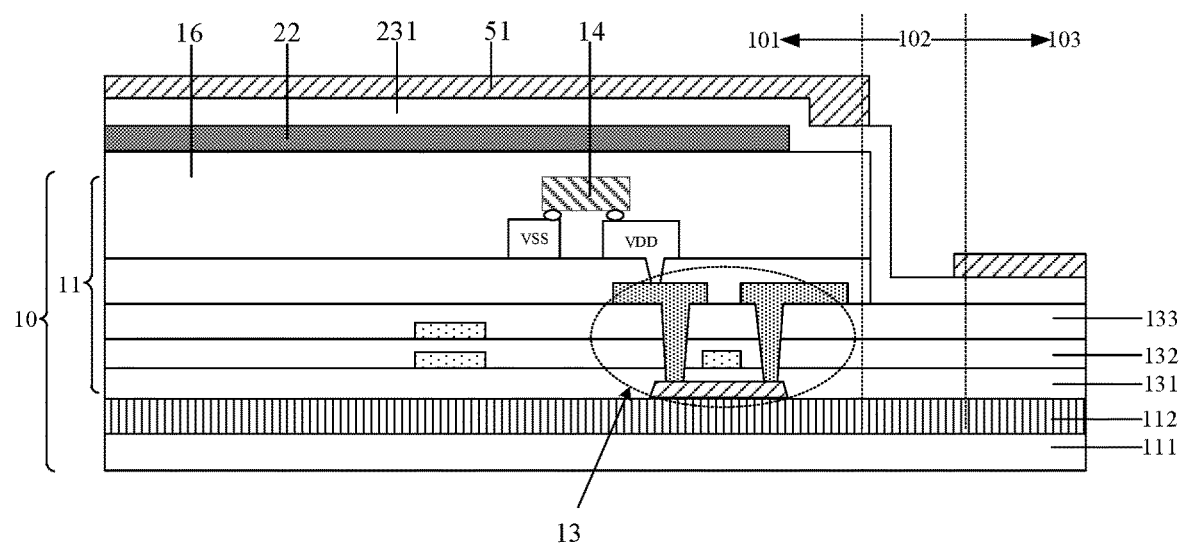
FIG. 10 is a schematic view illustrating a process of manufacturing a groove provided by an embodiment of the present disclosure.

S111, as shown in FIG. 10, forming an insulating film 231 and a first photoresist pattern 51 successively on a side of the second transparent conductive layer 22 facing away from the flexible display panel 10. The first photoresist pattern 51 includes a photoresist completely-removed region, and the photoresist completely-removed region at least corresponds to a portion of the bending region 102.

Figure 11:
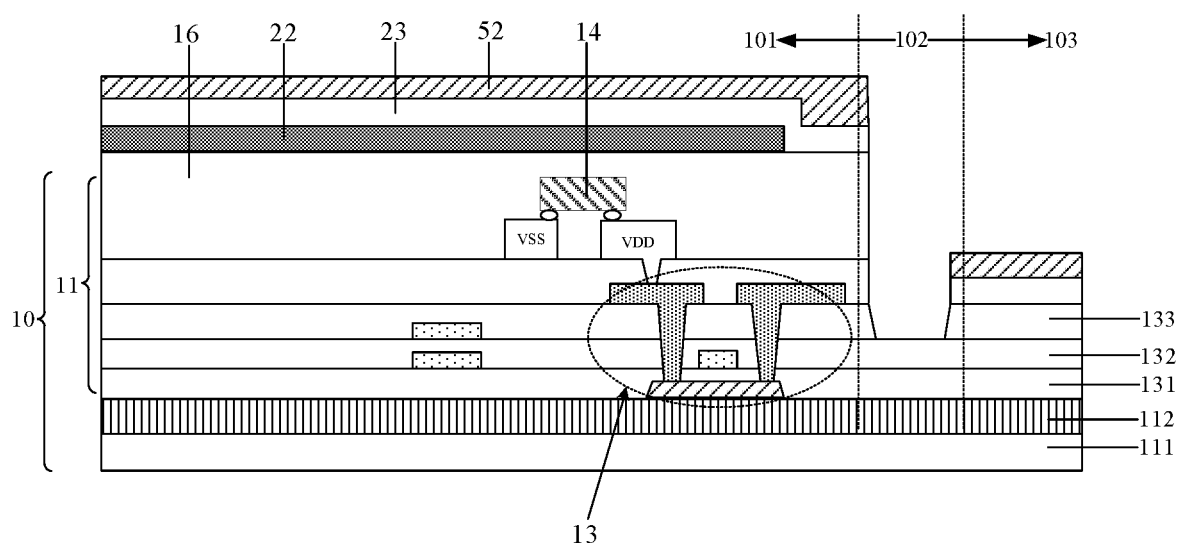
FIG. 11 is a schematic view illustrating a process of manufacturing a groove provided by an embodiment of the present disclosure.

S112, as shown in FIG. 11, over-etching the insulating film 231 to obtain an insulating layer 23.

In some embodiments, during the process of over-etching the insulating film 231, the portion in the interlayer insulating layer 133 that is located in the bending region 102 is at least etched, and the portions in the second gate insulating layer 132, the first gate insulating layer 131, etc. that are located in the bending region 102 may even be etched.

S113, stripping off the first photoresist pattern 51, and forming a second photoresist pattern 52 on a side of the insulating layer 23 facing away from the flexible display panel 10.

Here, for example, the first photoresist pattern 51 may be removed by an ashing process.

S114, etching the portion in the flexible display panel 10 that is located in the bending region 102 to obtain a groove.

That is, the remaining parts of the portions in the interlayer insulating layer 133, the second gate insulating layer 132, the first interlayer insulating layer 131, and the spacer layer 112 that are located in the bending region 102 are etched.

As shown in FIG. 3, on the basis of an example in which the thin film transistor is a top gate type thin film transistor, the substrate includes a flexible substrate 111 and a spacer layer 112, and the spacer layer 112 is disposed closer to the first transparent conductive layer 21 than the flexible substrate 111, the portions in the spacer layer 112, the first gate insulating layer 131, the second gate insulating layer 132, and the interlayer insulating layer 133 that are located in the bending region 102 are hollowed out to form a groove. Since the total thickness of the spacer layer 112, the first gate insulating layer 131, the second gate insulating layer 132, and the interlayer insulating layer 133 is relatively large, both the EBA and EBB processes need to be performed to form the groove completely.

However, in an embodiment of the present disclosure, at the time of forming the insulating layer 23 between the first transparent conductive layer 21 and the second transparent conductive layer 22, in the case of ensuring that the insulating layer 23 covers the second transparent conductive layer 22, it is possible to etch at least one of the interlayer insulating layer 133, the second gate insulating layer 132, the first gate insulating layer 131, and the spacer layer 112 while the insulating layer 23 is being formed, thereby omitting one of the EBA or EBB process.

Optionally, as shown in FIG. 5, after forming a first transparent conductive layer 21 on the light exit side of the flexible display panel, the method further comprises: forming a planarization layer 24 on a side of the first transparent conductive layer 21 facing away from the flexible display panel 10. The planarization layer 24 covers the main display region 101, the bending region 102, and driving circuit region 103. The material of the planarization layer 24 includes an organic insulating material, and the planarization layer 24 fills the groove.

In an embodiment of the present disclosure, the material of the planarization layer 24 includes an organic insulating material. The organic insulating material is more flexible than the inorganic insulating material. By filling the groove located in the bending region 102 with the planarization layer 24, on the one hand, the flexibility of the bending region 102 in the flexible display module 2 can be improved; on the other hand, compared with the prior art, the filling process after the EBA and EBB processes can be omitted, and one mask process can be further reduced.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims.

What is claimed is:

1. A flexible display module, comprising:
   a flexible display panel; and
   a first transparent conductive layer disposed on a light exit side of the flexible display panel,
   wherein the flexible display panel comprises a main display region, a bending region, and a driving circuit region; the main display region comprises a pixel array layer;
   the first transparent conductive layer comprises a first touch electrode located in the main display region, a driving circuit located in the driving circuit region, a first touch electrode lead electrically connected to the first touch electrode and the driving circuit, respectively, and a wiring electrically connecting the pixel array layer and the driving circuit,
   wherein the first touch electrode, the driving circuit, the first touch electrode lead and the wiring are arranged in a same layer.

2. The flexible display module according to claim 1, further comprising: a second transparent conductive layer and an insulating layer stacked with the first transparent conductive layer on the light exit side of the flexible display panel,
   wherein the first transparent conductive layer and the second transparent conductive layer are spaced apart by the insulating layer;
   the second transparent conductive layer comprises a second touch electrode located in the main display region, and a second touch electrode lead electrically connected to the second touch electrode and the driving circuit, respectively.

3. The flexible display module according to claim 2, wherein the second transparent conductive layer is disposed between the first transparent conductive layer and the flexible display panel.

4. The flexible display module according to claim 3, wherein the bending region is located between the main display region and the driving circuit region; the bending region comprises a groove; and
   an edge of the groove close to the main display region is flush with an edge of the insulating layer close to the driving circuit region.

5. The flexible display module according to claim 4, further comprising: a planarization layer disposed on a side of the first transparent conductive layer facing away from the flexible display panel, the planarization layer covering the main display region, the bending region and the driving circuit region;
   a material of the planarization layer comprising an organic insulating material, and the planarization layer filling the groove.

6. A flexible display device comprising the flexible display module according to claim 1.

7. The flexible display device according to claim 6, further comprising: a second transparent conductive layer and an insulating layer stacked with the first transparent conductive layer on the light exit side of the flexible display panel,
   wherein the first transparent conductive layer and the second transparent conductive layer are spaced apart by the insulating layer;
   the second transparent conductive layer comprises a second touch electrode located in the main display region, and a second touch electrode lead electrically connected to the second touch electrode and the driving circuit, respectively.

8. The flexible display device according to claim 7, wherein the second transparent conductive layer is disposed between the first transparent conductive layer and the flexible display panel.

9. The flexible display device according to claim 8, wherein the bending region is located between the main display region and the driving circuit region; the bending region comprises a groove;
   an edge of the groove close to the main display region is flush with an edge of the insulating layer close to the driving circuit region.

10. The flexible display device according to claim 9, further comprising: a planarization layer disposed on a side of the first transparent conductive layer facing away from the flexible display panel, the planarization layer covering the main display region, the bending region and the driving circuit region;
   a material of the planarization layer comprising an organic insulating material, and the planarization layer filling the groove.

* * * * *